United States Patent
Miyamoto et al.

(10) Patent No.: US 7,713,877 B2
(45) Date of Patent: May 11, 2010

(54) METHOD FOR FABRICATING DIELECTRIC ON METAL BY BAKING DIELECTRIC PRECURSOR UNDER REDUCED PRESSURE ATMOSPHERE

(75) Inventors: Yuki Miyamoto, Tokyo (JP); Hitoshi Saita, Tokyo (JP)

(73) Assignee: TDK Corporation, Tokyo (JP)

( * ) Notice: Subject to any disclaimer, the term of this patent is extended or adjusted under 35 U.S.C. 154(b) by 701 days.

(21) Appl. No.: 11/508,923

(22) Filed: Aug. 24, 2006

(65) Prior Publication Data

US 2007/0049026 A1    Mar. 1, 2007

(30) Foreign Application Priority Data

Aug. 31, 2005 (JP) ................ P2005-252435

(51) Int. Cl.
*H01L 21/44*    (2006.01)
*H01L 21/31*    (2006.01)

(52) U.S. Cl. ................ 438/687; 439/778; 257/E21.295

(58) Field of Classification Search ........... 438/687, 438/778; 257/E21.295
See application file for complete search history.

(56) References Cited

U.S. PATENT DOCUMENTS

| | | | |
|---|---|---|---|
| 5,144,527 A | 9/1992 | Amano et al. | |
| 6,169,049 B1 | 1/2001 | Witham et al. | |
| 6,207,522 B1* | 3/2001 | Hunt et al. | 438/393 |
| 6,541,137 B1 | 4/2003 | Kingon et al. | |
| 7,029,971 B2 | 4/2006 | Borland et al. | |
| 2002/0072223 A1* | 6/2002 | Gilbert et al. | 438/629 |
| 2004/0038554 A1* | 2/2004 | Ahn et al. | 438/778 |
| 2004/0043557 A1* | 3/2004 | Haukka et al. | 438/240 |
| 2004/0043634 A1* | 3/2004 | Vaartstra | 438/785 |
| 2005/0011857 A1 | 1/2005 | Borland et al. | |
| 2005/0164521 A1* | 7/2005 | Ahn et al. | 438/778 |
| 2007/0049051 A1* | 3/2007 | Ahn et al. | 438/778 |

FOREIGN PATENT DOCUMENTS

| | | |
|---|---|---|
| EP | 1 498 944 A1 | 1/2005 |
| EP | 1 551 041 A1 | 7/2005 |
| JP | A-05-112895 | 5/1993 |

(Continued)

OTHER PUBLICATIONS

W. Fan et al.; "Materials Science and Integration Bases for Fabrication of $(BA_xSr_{1-x})TiO_3$ Thin Film Capacitors with Layered Cu-Based Electrodes;" Journal of Applied Physics, vol. 94, No. 9, pp. 6192-6200, Nov. 2003.

(Continued)

*Primary Examiner*—Matthew Smith
*Assistant Examiner*—Walter H Swanson
(74) *Attorney, Agent, or Firm*—Oliff & Berridge, PLC

(57) ABSTRACT

A dielectric film production process comprising a baking step in which a dielectric film is formed by heating a precursor layer formed on a metal layer, wherein the metal layer contains at least one type of metal selected from the group consisting of Cu, Ni, Al, stainless steel and austenitic nickel-chromium-based superalloy and during at least part of the baking step the precursor layer is heated in a reduced pressure atmosphere.

12 Claims, 2 Drawing Sheets

FOREIGN PATENT DOCUMENTS

| | | |
|---|---|---|
| JP | A-2000-164460 | 6/2000 |
| JP | B2 3188179 | 5/2001 |
| JP | A-2004-339040 | 12/2004 |
| JP | A-2005-039282 | 2/2005 |
| KR | 1997-0059323 A | 8/1997 |
| KR | 10-2005-0058210 A | 6/2005 |
| KR | 10-0668562 B1 | 1/2007 |
| WO | WO 2004/079776 A2 | 9/2004 |

OTHER PUBLICATIONS

J Dawley et al.; "Base-metal Integration and Enhanced Dielectric Properties of <100> Oriented $SrTiO_3$ and $(Ba,Sr)TiO_3$ Thin Films;" MRS Fall Meeting 2003.

J. Maria et al.; "Lead Zirconate Titanate Thin Films on Base-Metal Foils: An Approach for Embedded High-Permittivity Passive Components;" Journal of the American Ceramic Society, vol. 84, No. 10, pp. 2436-2438, 2001.

B. Laughlin et al.; "TEM and Electrical Analysis of Sputtered Barium Strontium Titanate Films on Copper Substrate;" MRS Fall Meeting 2003.

R.J. Ong et al.; "Chemical Solution Deposition of Biaxially Oriendted $(Ba,Sr)TiO_3$ Thin Films on <100> Ni;" J. Mater. Res., vol. 18, No. 10, pp. 2311-2317, Oct. 2003.

Y. Fujisaki et al.; "Significant Enhancement of $Bi_{3.45}La_{0.75}Ti_3O_{12}$ Ferroelectricity Derived by Sol-Gel Method;" Jpn. J. Appl. Phys vol. 42, pp. 267-269, Mar. 2003.

T. Kijima et al.; "Effect of High-Pressure Oxygen Annealing on $Bi_2SiO_5$-Added Ferroelectric Thin Films;" Jpn. J. Appl. Phys., vol. 41, pp. 1164-1166, Oct. 2002.

Laughlin et al., "Preparation of Sputtered $(Ba_x,Sr_{1-x})TiO_3$ Thin Films Directly on Copper," Journal of the American Ceramic Society, vol. 88, No. 9 (2005), pp. 2652-2654.

Ong et al., "Chemical solution deposition of biaxially oriented $(Ba,Sr)TiO_3$ thin films on <100> Ni," Journal of Material Research, vol. 18, No. 10, Oct. 2003, pp. 2310-2317.

J.T. Dawley et al.; "Dielectric Properties of random and (100) Oriented $SrTiO_3$ and $(Ba,Sr)TiO_3$ Thin Films Fabricated on (100) Nickel Tapes;" Applied Physics Letter, vol. 81, No. 16, Oct. 14, 2002, pp. 3028-3030.

* cited by examiner

METHOD FOR FABRICATING DIELECTRIC ON METAL BY BAKING DIELECTRIC PRECURSOR UNDER REDUCED PRESSURE ATMOSPHERE

BACKGROUND OF THE INVENTION

1. Field of the Invention

The present invention relates to a dielectric film and to a process for its fabrication. A application Ser. No. 11/492,943 filed Jul. 26, 2006, issued as U.S. Pat. No. 7,539,005 on May 26, 2009 is related to the present application. The disclosure of the prior application is hereby incorporated herein by reference in its entirety.

2. Related Background Art

Solution methods are known as methods for forming dielectric films containing metal oxides such as barium strontium titanate (BST) on metal layers. In such solution methods, a solution containing prescribed starting materials is coated onto a metal layer and dried, and the formed precursor layer is baked to form a dielectric film. However, when the metal composing the metal layer is a readily oxidizing metal such as Cu or Ni, the metal layer becomes oxidized during the baking, thereby losing conductivity. When oxidation of the metal occurs, even if the dielectric constant of the dielectric layer itself is increased, for example, the capacity of the capacitor does not adequately increase. In order to prevent oxidation of the metal layer, therefore, there have been proposed methods such as a method of providing a buffer layer on the metal layer (W. Fan et al., Journal of Applied Physics, Vol. 94, No. 9, p. 6192), and methods of accomplishing the baking in a reducing environment such as $H_2O/H_2$ mixed gas or the like (Brian Laughlin et al., 2003 MRS Fall Meeting, Symposium C, 2003, p. 70; Jeff Dawley et al., 2003 MRS Fall Meeting, Symposium C, 2003, p. 70; R. J. Ong, J. Mater. Res., 2003, Vol. 18, No. 10, p. 2310).

The following publications are also concerned with formation of dielectric films: Jon-Paul Maria et al., J. Am. Ceram. Soc., Vol. 84, No. 10, p. 2436; Y. Fujisaki et al., Jpn. J. Appl. Phys., 2003, Vol. 42, p. L267; Y Fujisaki et al., Jpn. J. Appl. Phys., 2002, Vol. 41, p. L1164; and Japanese Patent Publication No. 3188179.

SUMMARY OF THE INVENTION

Yet although it has been possible to prevent oxidation of metals such as Cu during baking with the conventional art methods, the obtained dielectric films have not exhibited sufficiently high dielectric constant. Moreover, it has not been possible to obtain dielectric films with a satisfactory level of leak characteristic.

It is an object of the present invention to provide a dielectric film production process that allows formation of dielectric films with sufficiently high dielectric constant and an excellent leak characteristic, while preventing oxidation of metal layers. It is another object of the invention to provide a dielectric film with sufficiently high dielectric constant and an excellent leak characteristic.

The present invention provides a dielectric film production process comprising a baking step in which a dielectric film is formed by heating of a precursor layer formed on a metal layer, wherein the metal layer contains at least one type of metal selected from the group consisting of Cu, Ni, Al, stainless steel and austenitic nickel-chromium-based superalloy, and during at least part of the baking step the precursor layer is heated in a reduced pressure atmosphere.

With this process it is possible to form a dielectric film with sufficiently high dielectric constant and an excellent leak characteristic while preventing oxidation of the metal layer. It is thought that in this process, heating in the reduced pressure atmosphere notably reduces the frequency of oxygen impacting on the metal layer during baking, thereby preventing oxidation of the metal layer. On the other hand, while it was predicted that heating under a reduced pressure atmosphere would tend to produce oxygen defects in the dielectric film and reduce the dielectric constant, research by the present inventors showed that the dielectric constant of the obtained dielectric film is instead increased, while the leak characteristic is also improved.

It is preferable that in this process, the baking step comprises a pre-baking step in which the precursor layer is heated at 300 to 500° C. and a main baking step in which the precursor layer that has passed through the pre-baking step is heated at 400 to 1200° C. to form a dielectric film, and at least one of the pre-baking step and the main baking step preferably involve heating of the precursor layer in a reduced pressure atmosphere. This will yield a further improved dielectric film in terms of dielectric constant and leak characteristic. The main baking step does not necessarily need to be carried out continuously after the pre-baking step. For example, the baking step may further include one or more separate heating steps either before or after the main baking step of heating at 400 to 1200° C.

At least part of the baking step preferably involves heating of the precursor layer in a reduced pressure atmosphere prepared to a pressure of no greater than 200 Pa. This will allow the aforementioned effect of the invention to be exhibited even more prominently.

More preferably, the metal layer is Cu, and at least part of the baking step involves heating of the precursor layer in a reduced pressure atmosphere prepared to a pressure of between 0.01 Pa and 100 Pa. In another preferred mode, the metal layer is Ni, and at least part of the baking step involves heating of the precursor layer in a reduced pressure atmosphere prepared to a pressure of between 0.001 Pa and 10 Pa. This will yield a dielectric film with high dielectric constant and an excellent leak characteristic while preventing vaporization of the metal during baking.

The dielectric film of the invention is a dielectric film obtained by the aforementioned dielectric film production process of the invention. The dielectric film has high dielectric constant and an excellent leak characteristic.

DESCRIPTION OF THE PREFERRED EMBODIMENTS

Preferred embodiments of the invention will now be described in detail. However, the present invention is not limited to the embodiments described below.

Figure 1:
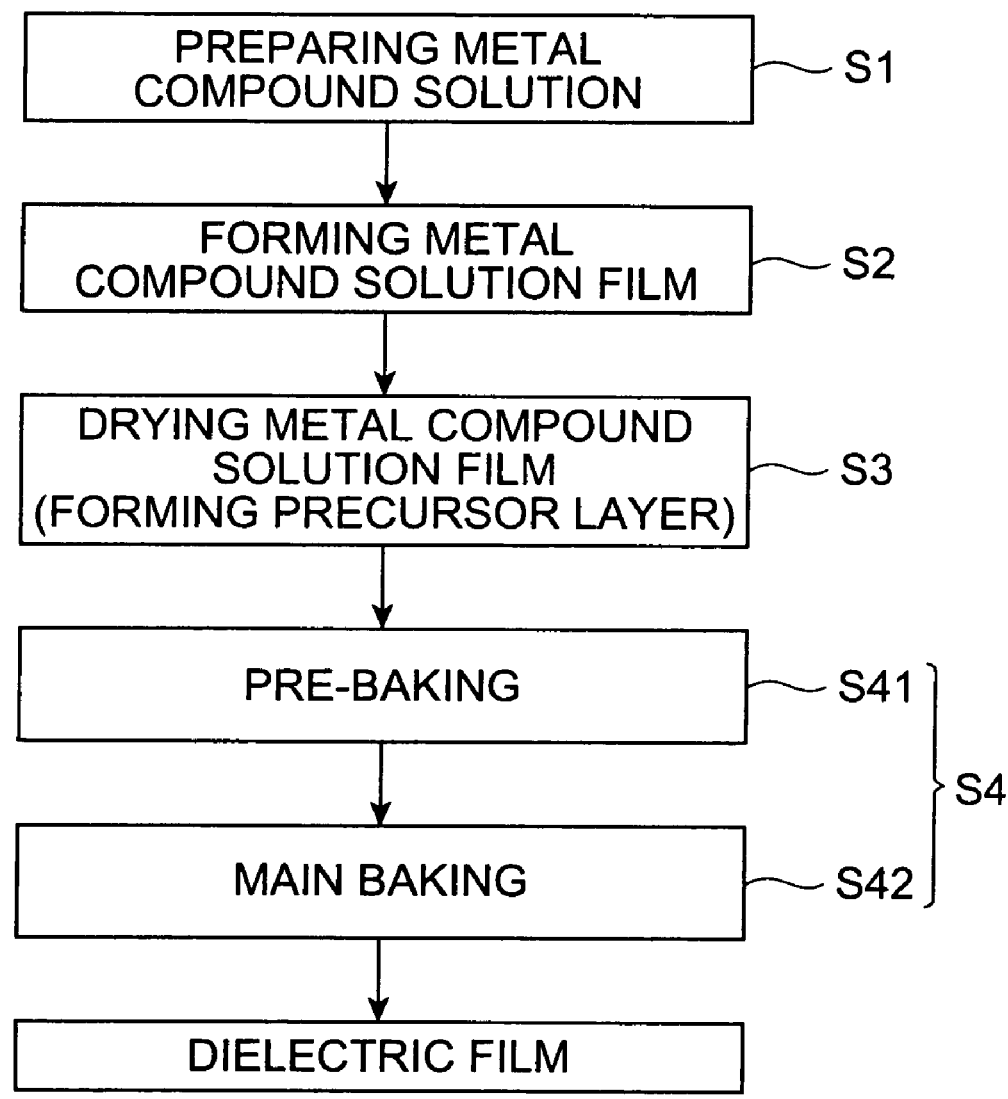
FIG. 1 is a flow diagram showing an embodiment of a dielectric film production process according to the invention.

FIG. 1 is a flow diagram showing an embodiment of a dielectric film production process according to the invention. The production process of this embodiment shown in FIG. 1 comprises steps of (S1) preparing a metal compound solution, (S2) forming a metal compound solution film, and (S3) drying the metal compound solution film and (S4) baking. Stated differently, the production process of this embodiment comprises a step of forming a solution film of a metal compound on a metal layer (S1,S2), a step of removing the solvent from the metal compound solution film to form a precursor layer containing the metal compound (S3) and a baking step wherein the precursor layer formed on the metal layer is heated to form a dielectric film (S4). The baking step S4 comprises a pre-baking step S41 and a main baking step S42. Such processes of using metal compound solutions as dielectric film precursors to obtain dielectric films are sometimes called chemical solution processes.

As metal compounds in the metal compound solution there may be used compounds that yield dielectric substances such as metal oxides upon baking. Preferred metal compounds include metal salts and metal alkoxides. Preferred metal salts are organic acid salts such as 2-ethylhexanoic acid salts and trifluoroacetic acid salts, but inorganic salts may also be used. More specifically, as examples of metal compounds to serve as precursors for the dielectric compound barium strontium titanate, there may be used organic acid salts of Ba, Sr and Ti mixed in prescribed proportions.

The metal compound solution is prepared by dissolving or dispersing the metal compounds in a solvent (S1). As solvents there are preferably used isoamyl acetate, amyl alcohol, alcohol-based solvents, toluene, xylene and the like. Metal compound solutions for production of dielectric substances are readily available as commercial reagents.

The metal compound solution is applied onto a metal layer to form a metal compound solution film (S2). The application method is not particularly restricted, and for example, spray coating may be mentioned. The coating coverage is preferably an amount of the metal oxide for a post-baking dielectric film thickness of 0.1 to 2.0 μm. Instead of being formed directly on a metal layer, the metal compound solution film may be formed in the state that a buffer layer is provided between metal layers and the metal solution film. In this case, the buffer layer is formed of aluminum nitride or the like.

The metal layer contains at least one type of metal selected from the group consisting of Cu, Ni, Al, stainless steel and austenitic nickel-chromium-based superalloy. Among these, the metal layer preferably contains Cu or Ni. These metals are readily oxidized, and with conventional methods it has been very difficult to form dielectric thin-films with high dielectric constant and excellent leak characteristics on metal layers containing these metals. According to this embodiment, however, it is possible to form dielectric thin-films with high dielectric constant and excellent leak characteristics while preventing oxidation of the metal layers, even when the metals mentioned above are used.

Removal of the solvent from the metal compound solution film by heating or the like forms a film of the metal compound as a precursor layer (S3). Here it is sufficient to remove most of the solvent, and its complete removal is not essential. Metal oxides may also be formed in portions of the precursor layer. When drying is accomplished by heating, the heating conditions may be appropriately adjusted depending on the type of solvent and the film thickness, but heating is generally preferred at 100 to 300° C. for 5 to 30 minutes. The heating may be conducted in air or under reduced pressure. Step S3 will normally be carried out separately from the subsequent baking step (S4), but these steps may also be carried out continuously or simultaneously.

The dried precursor layer is subjected to the pre-baking step (S41) and main baking step (S42) to produce a dielectric film (S4). In the baking step, the metal compound is heated to decomposition to produce a metal oxide, while also decomposing and removing the organic component if it is an organic acid salt. In other words, the precursor layer resulting from the pre-baking step is composed mainly of an amorphous metal oxide. However, a portion of the metal oxide may be crystallized after the pre-baking step. The heating conditions for the pre-baking step may be adjusted as appropriate for the type of metal compound, in order to adequately promote production of the metal oxide from the precursor. Specifically, in order to efficiently and adequately promote production of the metal oxide in the pre-baking step, the precursor layer is preferably heated at 250 to 550° C. and more preferably it is heated to 300 to 500° C. If the temperature is below 300° C. or above 500° C., a large amount of carbon may remain in the starting liquid, tending to prevent adequate metal oxide production. The heating time for the pre-baking step is preferably about 5 to 30 minutes.

The precursor layer obtained from the pre-baking step is then heated in the main baking step. This will promote crystallization of the metal oxide to obtain a dielectric film with high dielectric constant. In order to adequately promote crystallization in the main baking step, the precursor layer is preferably heated at 400 to 1200° C. and more preferably it is heated at 600 to 900° C. If this temperature is below 400° C. crystallization will tend to be inadequately promoted, and if it is higher than 1200° C. the amount of vaporization of the metal from the metal layer will tend to be increased. The heating time for the main baking step is preferably about 5 to 60 minutes. Instead of separately conducting a pre-baking step and a main baking step as for this embodiment, the dried precursor layer may be directly formed into a dielectric film by a single baking step. Also, instead of conducting the pre-baking step (S1) and the main baking step (S2) in direct succession as for this embodiment, one or more separate heating steps may be added between the pre-baking step (S1) and the main baking step (S2).

For this embodiment, the heating in the pre-baking step or main baking step is accomplished in a reduced pressure atmosphere where the pressure is reduced to below 1 atmosphere. The reduced pressure atmosphere for heating is preferably no greater than 200 Pa and more preferably no greater than 100 Pa. Heating in a reduced pressure atmosphere of no greater than 200 Pa will particularly increase the dielectric constant of the obtained dielectric film while also further reducing leak current. Particularly when the metal layer is composed mainly of Cu, the pressure range of the reduced pressure atmosphere is preferably at least 0.01 Pa and more preferably at least 0.1 Pa, and preferably no greater than 100 Pa and more preferably no greater than 50 Pa. On the other hand, when the metal layer is composed mainly of Ni, the pressure range of the reduced pressure atmosphere is preferably at least 0.001 Pa and more preferably at least 0.01 Pa, and preferably no greater than 10 Pa and more preferably no greater than 1 Pa. If the pressure is within these ranges, vaporization of the metal during baking can be sufficiently inhibited while a dielectric film with high dielectric constant can be formed more efficiently. The value of the pressure is the pressure in the furnace as measured using a manometer.

The reduced pressure atmosphere may be formed, for example, in a sealed heating furnace using ordinary equipment such as a vacuum pump. As an example of more specific means, the reduced pressure atmosphere may be formed to a prescribed pressure (preferably no greater than 10 Pa) and the temperature increased to a prescribed temperature in the formed reduced pressure atmosphere, for heating in the reduced pressure atmosphere. Conversely, heating may be carried out to a prescribed temperature at ordinary pressure and then a reduced pressure atmosphere formed in the heating furnace.

The baking step including the pre-baking step and main baking step may also include a procedure involving heating in a non-pressure-reduced atmosphere. For example, instead of reducing the pressure for both the pre-baking step and main baking step as for this embodiment, heating may be conducted in air for the pre-baking step and heating may be conducted in a reduced pressure atmosphere for the main baking step.

Figure 2:
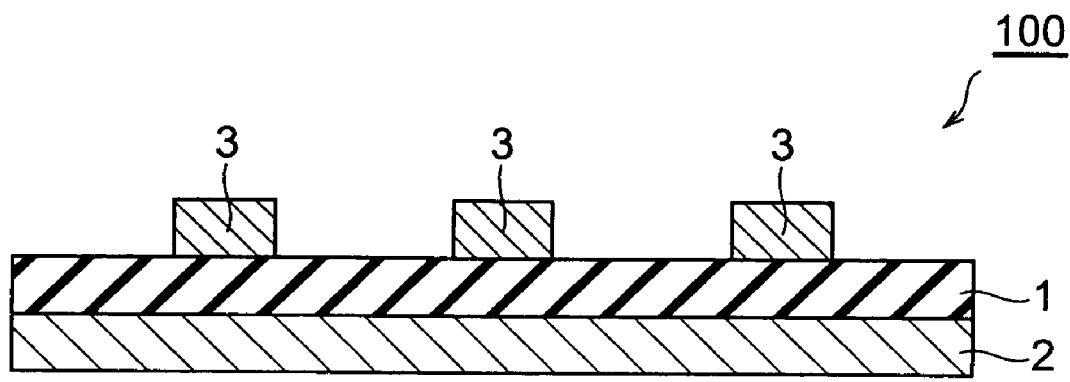
FIG. 2 is a cross-sectional view showing a capacitor provided with a dielectric film as an embodiment of the invention.

FIG. 2 is a cross-sectional view showing a capacitor provided with a dielectric film as an embodiment of the invention. The capacitor 100 shown in FIG. 2 is provided with a dielectric film 1, and a first electrode 2 and multiple second electrodes 3 situated opposing each other and sandwiching the dielectric film 2. A capacitor function is obtained at the sections where the first electrode 2 and second electrodes 3 face each other.

The dielectric film 1 is formed on the first electrode 2 composed of a metal layer, by the production process described above. The dielectric film 1 is preferably a "thin-film". More specifically, the thickness of the dielectric film 1 is preferably 0.1 to 2.0 μm.

As dielectric substances composing the dielectric film 1 there may be suitably used metal oxides such as barium titanate, strontium titanate, barium strontium titanate and lead zirconium titanate. Among these, the dielectric film 1 preferably contains at least one compound selected from the group consisting of barium titanate, strontium titanate and barium strontium titanate.

As mentioned above, the first electrode 2 contains at least one type of metal selected from the group consisting of Cu, Ni, Al, stainless steel and austenitic nickel-chromium-based superalloy. A metal foil such as Cu foil or Ni foil may be suitably used as the first electrode 2. On the other hand, the second electrodes 3 may be formed of these metals or they may contain a precious metal such as Pt. The second electrodes 3 can be satisfactorily formed by a physical gas-phase growth method such as sputtering.

The dielectric film of the invention can be employed as a thin-film capacitor as in the case of this embodiment, or as a dielectric film for an element such as a DRAM, FeRAM, filter or the like.

The present invention will now be explained in greater detail by working examples. However, the invention is not limited to the working examples described below.

Example 1

Metal alkoxides containing Ba, Sr and Ti were mixed with isoamyl acetate and amyl alcohol in a weight ratio of 20:70:10 and dissolved to obtain a precursor solution, which was applied onto a copper foil (product of Nilaco, 100 μm thickness, rolled foil) as the lower electrode by spin coating (3000 rpm, 15 sec). After application, it was heated in air on a hot plate at 150° C. for 10 minutes to dry the film and form a precursor layer on the copper foil.

Next, the laminate comprising the copper foil and precursor layer was placed in an infrared heating furnace and a reduced pressure atmosphere was formed in the furnace using a vacuum pump to a pressure of 0.1 Pa as measured by a manometer at room temperature. The temperature in the furnace was raised to 400° C. while continuing pressure reduction with the vacuum pump, for 30 minutes of heating in that condition (pre-baking). The same application, drying and pre-baking were repeated 4 to 6 times to obtain a precursor layer with the prescribed thickness. This was followed by further heating for 30 minutes at 700 to 800° C. in an infrared heating furnace with the pressure reduced to 0.1 Pa as for the pre-baking, to form a dielectric film (main baking). Next, a Pt electrode was formed on the dielectric film by sputtering, as the upper electrode. The dielectric property and leak current of the fabricated dielectric film were evaluated.

The dielectric constant was determined by measuring the impedance between the lower electrode and upper electrode at room temperature (RT) using an impedance analyzer ("YHP-4194", trade name of Agilent Technologies). The leak current was evaluated by measuring the current between the lower electrode and upper electrode at room temperature (RT) using a semiconductor parameter analyzer ("4156C", trade name of Agilent Technologies).

Example 2

A precursor solution containing 2-ethylhexanoic acid salts of Ba, Sr and Ti as metal oxide precursors was applied onto a Ni foil (product of Nilaco, 100 μm thickness, rolled foil) as the lower electrode by spin coating (3000 rpm, 20 sec). After application, it was heated in air on a hot plate at 150° C. for 10 minutes to dry the film and form a precursor layer on the nickel foil. Next, the precursor layer was heated at 400° C. for 10 minutes on a hot plate in air (pre-baking). The same application, drying and pre-baking were repeated 10 times to obtain a precursor layer with the prescribed thickness. This was followed by further heating for 30 minutes at 800° C. in an infrared heating furnace with the pressure reduced to 0.05 Pa by the same method as in Example 1, to form a dielectric film (main baking). Next, a Pt electrode was formed on the dielectric film by sputtering, as the upper electrode. The dielectric property and leak current of the fabricated dielectric film were evaluated in the same manner as Example 1.

Comparative Example

A dielectric film was fabricated in the same manner as Example 2, except that for the main baking, heating was conducted for 30 minutes in a non-Ni-oxidizing atmosphere comprising a hydrogen/nitrogen mixed gas (oxygen partial pressure: $1.013 \times 10^{-14}$ Pa) without pressure reduction, at atmospheric pressure, 800° C. The dielectric property and leak current of the fabricated dielectric film were evaluated in the same manner as Example 1.

TABLE 1

| | Number of layers | Thickness (nm) | Osc = 1 V, RT, 100 kHz | | Leak current, RT Field intensity: 100 kV/cm |
|---|---|---|---|---|---|
| | | | C/A (uF/cm$^2$) | tanδ (%) | |
| Example 1 | 4 | 200 | 3 | 1.5 | $9.8 \times 10^{-9}$ |
| | 6 | 364 | 1.9 | 3.6 | $1.2 \times 10^{-9}$ |
| Example 2 | 10 | 328 | 1.9 | 1.4 | $2.0 \times 10^{-5}$ |
| Comparative Example | 10 | 417 | 0.7 | 6.9 | $2.6 \times 10^{-2}$ |

As shown in Table 1, it was confirmed that capacitors with high capacity (C/A) were obtained by using the dielectric films of Examples 1 and 2 fabricated by baking under reduced pressure. It was also confirmed that the leak current was sufficiently low. In contrast, the dielectric film of the comparative example wherein the main baking was carried out in air had significantly lower capacity at 100 kHz compared to the examples, as well as an increased leak current value. In other words, it was confirmed that the present invention provides a dielectric film with sufficiently high dielectric constant and an excellent leak characteristic.

According to the dielectric film production process of the invention, it is possible to form a dielectric film with sufficiently high dielectric constant and an excellent leak characteristic, while preventing metal layer oxidation. In addition, since this production process does not necessarily require a buffer layer to prevent metal layer oxidation, the steps can be simplified and production costs can be lowered. Furthermore, while production steps of the prior art using a reducing atmosphere containing $H_2$ require special equipment and thus tend to be associated with increased production cost, the present invention can yield a dielectric film with sufficient characteristics without using a reducing atmosphere, and therefore the present invention is advantageous from this viewpoint as well.

What is claimed is:

1. A dielectric film production process comprising a baking step including a pre-baking step in which a metal oxide composed mainly of an amorphous metal oxide is formed by heating a precursor layer formed on a metal layer and a main baking step in which a crystallized dielectric film is formed by heating the metal oxide, wherein the metal layer contains at least one type of metal selected from the group consisting of Cu, Ni, Al, stainless steel and austenitic nickel-chromium-based superalloy, and during at least part of the pre-baking step and the main baking step the precursor layer and/or the metal oxide is heated in a reduced pressure atmosphere.

2. A dielectric film production process according to claim 1, wherein said baking step includes a pre-baking step in which the precursor layer is heated at 300 to 500° C. and a main baking step in which the precursor layer that has passed through said pre-baking step is heated at 400 to 1200° C. to form said dielectric film, and either or both said pre-baking step and said main baking step involve heating of the precursor layer in a reduced pressure atmosphere.

3. A dielectric film obtainable by a dielectric film production process according to claim 2.

4. A dielectric film production process according to claim 1, wherein at least part of said baking step involves heating of the precursor layer in a reduced pressure atmosphere prepared to a pressure of no greater than 200 Pa.

5. A dielectric film obtainable by a dielectric film production process according to claim 3.

6. A dielectric film production process according to claim 1, wherein said metal layer is Cu, and at least part of said baking step involves heating of the precursor layer in a reduced pressure atmosphere prepared to a pressure of between 0.01 Pa and 100 Pa.

7. A dielectric film obtainable by a dielectric film production process according to claim 6.

8. A dielectric film production process according to claim 1, wherein said metal layer is Ni, and at least part of said baking step involves heating of the precursor layer in a reduced pressure atmosphere prepared to a pressure of between 0.001 Pa and 10 Pa.

9. A dielectric film obtainable by a dielectric film production process according to claim 8.

10. A dielectric film obtainable by a dielectric film production process according to claim 1.

11. A dielectric film production process according to claim 1, wherein the main baking step is conducted in the reduced pressure atmosphere.

12. A dielectric film production process according to claim 1, wherein a dielectric substance composing the crystallized dielectric film contains at least one compound selected from the group consisting of barium titanate, strontium titanate, barium strontium titanate and lead zirconium titanate.

* * * * *